(12) United States Patent
Sugiyama et al.

(10) Patent No.: US 7,901,843 B2
(45) Date of Patent: Mar. 8, 2011

(54) PROCESS FOR SMOOTHING SURFACE OF GLASS SUBSTRATE

(75) Inventors: Takashi Sugiyama, Chiyoda-ku (JP);
Yoshiaki Ikuta, Chiyoda-ku (JP);
Masabumi Ito, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 346 days.

(21) Appl. No.: 12/122,407

(22) Filed: May 16, 2008

(65) Prior Publication Data

US 2009/0286166 A1 Nov. 19, 2009

(51) Int. Cl.
*G03F 1/00* (2006.01)

(52) U.S. Cl. .................................. 430/5; 65/28
(58) Field of Classification Search .............. 430/5, 311, 430/316, 394; 250/309; 355/53
See application file for complete search history.

(56) References Cited

U.S. PATENT DOCUMENTS

| | | | |
|---|---|---|---|
| 5,104,482 A * | 4/1992 | Monkowski et al. | 438/698 |
| 2002/0098421 A1 * | 7/2002 | Hasegawa et al. | 430/5 |
| 2003/0165751 A1 * | 9/2003 | Elian et al. | 430/5 |
| 2003/0184721 A1 * | 10/2003 | Itoh | 355/53 |
| 2005/0118533 A1 * | 6/2005 | Mirkarimi et al. | 430/316 |
| 2005/0208389 A1 * | 9/2005 | Ishibashi et al. | 430/5 |
| 2006/0022134 A1 * | 2/2006 | Takaoka et al. | 250/309 |

OTHER PUBLICATIONS

International Organization for Standardization, et al., "Specification for Extreme Ultraviolet Lithography Mask Substrates", SEMI P37-1102, SEMI 2001, 2002, pp. 1-10.
American Society for Quality Control, et al., "Specification for Absorbing Film Stacks and Multilayers on Extreme Ultraviolet Lithography Mask Blanks", SEMI P38-1102, SEMI 2002, pp. 1-8.
Alan Stivers, et al., "Evaluation of the Capability of a Multibeam Confocal Inspection System for Inspection of EUVL Mask Blanks", 22$^{nd}$ Annual BACUS Symposium on Photomask Technology, Proceedings of SPIE, vol. 4889, 2002, pp. 408-417.

* cited by examiner

*Primary Examiner* — Mark F Huff
*Assistant Examiner* — Rashid Alam
(74) *Attorney, Agent, or Firm* — Oblon, Spivak, McClelland, Maier & Neustadt, L.L.P.

(57) ABSTRACT

There is provided a process for smoothing a substrate surface having a concave defect, such as a pit or a scratch. A process for smoothing a surface of a glass substrate for a reflective mask blank used in EUV lithography, comprising disposing a thin film on a glass substrate; detecting a concave defect existing on the glass substrate; and locally heating or locally anodizing a portion of the thin film just above the detected concave defect to perform a chemical reaction accompanied by a volume increase in a material forming the thin film.

26 Claims, 2 Drawing Sheets

PROCESS FOR SMOOTHING SURFACE OF GLASS SUBSTRATE

BACKGROUND OF THE INVENTION

1. Field of the Invention

The present invention relates to a process for smoothing the surface of a glass substrate. More specifically, the present invention relates to a process for smoothing the surface of a glass substrate for a reflective mask blank used in EUV (Extreme Ultra Violet) lithography (hereinbelow, referred to as "EUV mask blank" in Description). Further more specifically, the present invention relates to a process for smoothing the surface of a glass substrate for an EUV mask blank, which has a concave defect thereon.

The present invention also relates to an EUV mask blank using a substrate for an EUV mask blank, the substrate having a surface smoothed by the smoothing process, and an EUV mask obtainable by patterning the EUV mask blank.

2. Discussion of Background

An EUV mask blank is fabricated by stacking a reflective film for reflecting EUV light and an absorbing layer for absorbing EUV light on a glass substrate in this order. It is most common that the reflective film is formed of a reflective multilayer film, which has Molybdenum (Mo) films as low refractive layers and Silicon (Si) films as high refractive layers alternately stacked therein, thereby having a high light-reflectivity when EUV light is applied thereon.

If a fine irregularity exists on the surface of a substrate used for fabrication of an EUV mask blank, the irregularity has an adverse effect on the reflective film and the absorbing layer, which are formed on the substrate. For example, if a fine irregularity exists on the surface of a substrate, the periodic structure of a reflective multilayer film formed as a reflective film on the substrate is disordered. When a desired pattern of a mask is printed on a photosensitive organic film (a so-called photoresist film) on a Si wafer by using a an exposing system, a portion of the desired pattern may have a lack of pattern or an excessive pattern other than the desired pattern in some cases. The disorder in the periodic structure of a reflective multilayer film, which is caused by an irregularity existing on the substrate, is called a phase defect, which causes a significant problem. It is desired that no irregularities having a size of a certain value or more exist on a substrate.

Non-patent documents 1 and 2 describe requirements relating to a defect in an EUV mask and an EUV mask blank. The requirements for such a defect are significantly severe. Non-patent document 1 has disclosed that a defect having a size of 50 nm or more is not permissible since the presence of such a defect on a substrate disorders the structure in a multilayer film to 5 form an unexpected shape in a pattern projected onto a resist on a Si wafer. Non-patent document 1 has also disclosed that the surface roughness of a substrate needs to be less than 0.15 nm in rms (root-mean-square) in order to prevent the roughness of a line edge from increasing in a pattern projected onto a resist on a Si wafer. Non-patent document 2 has disclosed that it is not permissible that a defect having a size of more than 25 nm exists on a mask blank coated with a reflective multilayer film, which is used in EUV lithography.

Non-patent document 3 describes what size of a defect on a substrate can be printed. Non-patent document 3 has disclosed that it is likely that a phase defect changes a line width of a printed image. A phase defect including a surface bump having a height of 2 nm and a FWHM (full width at half maximum) of 60 nm is a phase defect that is at the border line as to whether the phase defect can be printed or not. This document has also disclosed that a defect having such a size causes an impermissible change of 20% in line width (140 nm on a mask) with respect to a line having a width of 35 nm.

Non-Patent Document 1: SEMI, P. 37-1102 (2002), "Specification for extreme ultraviolet lithography mask substrate"

Non-Patent Document 2: SEMI, P. 38-1102 (2002), "Specification for absorbing film stacks and multilayers on extreme ultraviolet lithography mask blanks"

Non-Patent Document 3: SPIE, vol. 4889, Alan Stivers., et. al., p. 408-417 (2002), "Evaluation of the Capability of a Multibeam Confocal Inspection System for Inspection of EUTVL Mask Blanks"

SUMMARY OF THE INVENTION

Among fine irregularities existing on a substrate surface, a convex defect, such as a foreign substance, a particle formed of a fiber, or a bump formed on a substrate itself, can be removed by a conventional wet cleaning method using hydrofluoric acid or ammonia water, by brush-cleaning, by fine polishing or by another method.

However, a concave defect, such as a pit or a scratch, cannot be removed by these methods. When the wet cleaning method using hydrofluoric acid or ammonia water is applied to remove a convex defect, a concave defect could be newly formed on the substrate surface since it is necessary to slightly etch the substrate surface in order to remove the convex defect from the substrate by lift-off. Even when brush-cleaning is applied to remove a convex defect, a concave defect could be newly formed on the substrate surface.

It is an object of the present invention to solve the problems of the prior art described above and to provide a process for smoothing a substrate surface having a concave defect, such as a pit or a scratch.

It is another object of the present invention to provide a glass substrate for an EUV mask blank, which is obtainable by the process for smoothing such a substrate surface.

It is a further object of the present invention to provide a substrate with a reflective film for an EUV mask blank, which is formed of the above-mentioned substrate for an EUV mask blank, and an EUV mask blank.

In order to attain the above-mentioned objects, the present invention provides a process for smoothing the surface of a glass substrate for a reflective mask blank used in EUV lithography, including:

disposing a thin film on a glass substrate;

detecting a concave defect existing on the glass substrate; and locally heating a portion of the thin film just above the detected concave defect to perform a chemical reaction accompanied by a volume increase in a material forming the thin film (hereinbelow, referred to as "the first substrate smoothing process according to the present invention").

In the first substrate smoothing process according to the present invention, the chemical reaction is preferably an oxidation reaction.

In the first substrate smoothing process according to the present invention, the chemical reaction is preferably a nitriding reaction.

In the first substrate smoothing process according to the present invention, the thin film preferably contains a main component, which is formed of at least one material selected from the group consisting of Al, B, Co, Cr, Ge, Hf, Mo, Nb, Ni, Ru, Si, Ta, Ti, Zn and Zr.

In the first substrate smoothing process according to the present invention, the thin film may contain at least two films formed of different materials, and the chemical reaction may be accompanied by mutual diffusion between the materials forming the at least two films.

When the thin film contains at least two films formed of different materials, one of the at least two films preferably contains a main component, which is formed of at least one material selected from the group consisting of Al, B, Co, Cr, Ge, Hf, Mo, Nb, Ni, Ru, Si, Ta, Ti, Zn and Zr.

In the first substrate smoothing process according to the present invention, the thin film has a thickness of preferably 0.5 to 10 times the depth of a concave defect existing on the glass substrate and having a maximum depth.

In the first substrate smoothing process according to the present invention, the crystalline state of the locally heated portion of the thin film is preferably made amorphous by the above-mentioned chemical reaction.

In the first substrate smoothing process according to the present invention, the crystalline state of the thin film is preferably amorphous after the local heating step is performed.

In the first substrate smoothing process according to the present invention, the local heating step is preferably performed by applying a laser ray on such a portion of the thin film just above the detected concave defect.

When the local heating step is performed by applying a laser ray, the laser ray has a diameter of preferably two times or less the diameter of the concave defect existing on the glass substrate.

When the local heating step is performed by applying a laser ray, it is preferred that the concave defect be detected by applying a laser ray and that the laser ray used in the local heating step and the laser ray used in detection of the concave defect have a common laser ray source.

In the first substrate smoothing process according to the present invention, it is preferred that the concave defect be detected by an atomic force microscope (AFM), a scanning tunneling microscope (STM) or a stylus profilometer, which has a heatable probe, and that the local heating step be performed by heating the heatable probe brought close to or into contact with such a portion of the thin film just above the concave defect.

In the first substrate smoothing process according to the present invention, the thin film may have a surface polished by a needle member after the local heating step is performed.

When the step for detecting the concave defect and the local heating step are performed by the heatable probe of such an AFM, an STM or a stylus profilometer, the thin film preferably has a surface polished by the above-mentioned probe after the local heating step is performed.

In order to attain the above-mentioned objects, the present invention also provides a process for smoothing the surface of a glass substrate for a reflective mask blank used in EUV lithography, including:

disposing a thin film on a glass substrate;

detecting a concave defect existing on the glass substrate; and locally anodizing a portion of the thin film just above the detected concave defect to perform a chemical reaction accompanied by a volume increase in a material forming the thin film (hereinbelow, referred to as "the second substrate smoothing process according to the present invention").

In the second substrate smoothing process according to the present invention, the thin film preferably contains a main component, which is formed of at least one material selected from the group consisting of Al, B, Co, Cr, Ge, Hf, Mo, Nb, Ni, Ru, Si, Ta, Ti, Zn and Zr.

In the second substrate smoothing process according to the present invention, the thin film has a thickness of preferably 0.5 times or more the depth of a concave defect existing on the glass substrate and having a maximum depth.

In the second substrate smoothing process according to the present invention, the crystalline state of the locally anodized portion of the thin film is preferably made amorphous by the above-mentioned chemical reaction.

In the second substrate smoothing process according to the present invention, the crystalline state of the thin film is preferably amorphous after the local anodizing step is performed.

In the second substrate smoothing process according to the present invention, it is preferred that the concave defect be detected by an atomic force microscope (AFM), a scanning tunneling microscope (STM) or a stylus profilometer, which has an energizable probe, and that local anodizing step be performed by applying a voltage across the thin film and the energizable probe brought close to or into contact with such a portion of the thin film just above the concave defect.

In the second substrate smoothing process according to the present invention, the thin film may have a surface polished by a needle member after the local anodizing step is performed.

When the step for detecting the concave defect and the local heating step are performed by the heatable probe of such an AFM, a STM or a stylus profilometer, the thin film preferably has a surface polished by the above-mentioned probe after the local anodizing step is performed.

The present invention also provides a substrate with a reflective film for EUV lithography, which has a reflective film for reflecting EUV light disposed on a substrate for a reflective mask blank used in EUV lithography, the substrate for a reflective mask blank having a surface smoothed by the first or second substrate smoothing process according to the present invention (hereinbelow, referred to as "the substrate with a reflective film according to the present invention").

The present invention also provides a reflective mask blank for EUV lithography, which has an absorbing layer disposed on the reflective film of the above-mentioned substrate with a reflective film according to the present invention (hereinbelow, referred to as "the EUV mask blank according to the present invention").

The present invention also provides a reflective mask for EUV lithography, wherein the above-mentioned EUV mask blank according to the present invention is patterned (hereinbelow, referred to as "the EUV mask according to the present invention").

In accordance with the substrate smoothing process according to the present invention, it is possible to decrease the number of concave defects or fix a concave defect existing on a thin film by disposing the thin film on a glass substrate used for EUV mask blank and having a concave defect thereon, locally heating a portion of the thin film just above the concave defect, i.e. a portion of the thin film with a concave defect appearing thereon, to perform a chemical reaction accompanied by a volume increase in a material forming the thin film (the first substrate smoothing process according to the present invention); or by locally anodizing a portion of the thin film with a concave defect appearing thereon to perform a chemical reaction accompanied by a volume increase in a material forming the thin film (the second substrate smoothing process according to the present invention). In accordance with the present invention, the thin film surface, which serves as a deposition surface to have a reflection film or an absorbing layer disposed thereon at the time of fabricating an EUV mask blank, is smoothed so as to have a smoothness improved to such a degree that no problem is caused in terms of substrate for such an EUV mask blank.

A convex defect existing on a substrate surface can be removed by a conventional wet cleaning method using hydrofluoric acid or ammonia water, by brush-cleaning or by fine polishing. However, when these methods are applied for the purpose of removing such a convex defect, a concave defect is newly formed on the substrate surface in some cases. In accordance with the present invention, the deposition surface of a glass substrate is smoothed so as to have a smoothness improved to such a degree that no problem is caused in terms of substrate for such an EUV mask blank, even if such a new concave defect is formed on the deposition surface.

MEANING OF SYMBOLS

Figure 1:
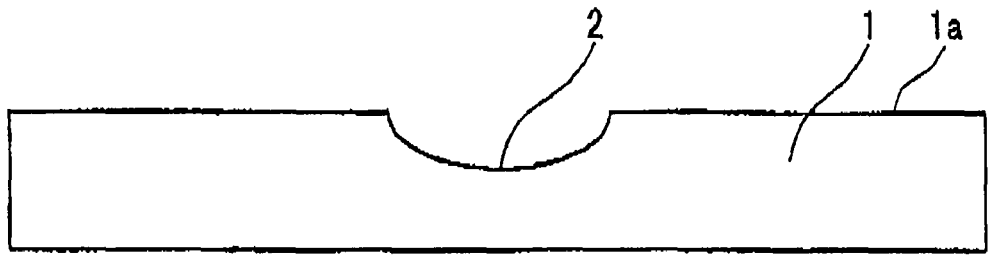
FIG. 1 is a schematic view showing a portion of a glass substrate with a concave defect existing thereon.

1: substrate
1a: deposition surface
2: concave defect (concave defect existing on substrate deposition surface)
3 and 3': thin film
4: concave defect (concave defect appearing on thin film surface)
5: heatable probe
6: energizable probe
7: convex defect removed by probe 5 or 6

DETAILED DESCRIPTION OF THE PREFERRED EMBODIMENTS

Now, the substrate smoothing process according to the present invention will be described in reference to the accompanying drawings.

The substrate smoothing process according to the present invention is used for the purpose of smoothing the surface of a glass substrate for an EUV mask blank, more specifically the surface of a glass substrate with a reflective film and an absorbing layer disposed at the time of fabricating an EUV mask blank (hereinbelow referred to as "deposition surface"). It should be noted that the surface of a glass substrate with a conductive film for a static chuck disposed thereon may be smoothed by the substrate smoothing process according to the present invention at the time of fabricating such an EUV mask blank. Now, description will be made about a case where the deposition surface of a glass substrate for an EUV mask blank is smoothed.

When the substrate smoothing process according to the present invention is performed, the deposition surface of a preprepared glass substrate for an EUV mask blank is first polished by abrasive grains formed of, e.g., a cerium oxide, a zirconium oxide or colloidal silica, is cleaned by an acid solution, such as hydrofluoric acid, silicofluoric acid or sulfuric acid, by an alkaline solution, such as ammonia water or by pure water and is dried. If a convex defect, such as a foreign substance, a particle formed of a fiber, or a bump formed on the substrate itself, exists on the deposition surface, the convex defect is removed by these steps.

The substrate smoothing process according to the present invention is advantageously applied to a deposition surface with a convex defect removed by conducting the surface polishing treatment and the cleaning treatment as in the steps described above.

A glass substrate for an EUV mask blank is required to have a high smoothness and a high flatness over the entire deposition surface. Specifically, the deposition surface of a glass substrate is required to have a smooth surface having a surface roughness of 0.15 nm or less in rms (root-mean-square) and a flatness of 50 nm or less. However, even if the deposition surface meets the requirements in terms of these values, a concave defect, which is called a pit or a scratch, locally exists on the deposition surface in some cases.

If the size of a concave defect existing on the deposition surface of a glass substrate is quite small, it is not probable that the concave defect has no adverse effect on an EUV mask blank, which is fabricated by using the glass substrate. However, if a concave defect, which has a size of a certain value or more, exists on the deposition surface of a glass substrate, a concave defect appears on the surface of a reflective film or the surface of an absorbing layer disposed on the deposition surface, causing a defect in an EUV mask blank fabricated by using such a glass substrate, in some cases.

It is impossible to generalize what size of a concave defect on the deposition surface of a glass substrate serves as a defect of an EUV mask blank, since it depends on the diameter, the depth and the shape of the concave defect. For example, if a concave defect having a diameter of 30 nm or more and a depth of 3 nm or more exists on the deposition surface of a glass substrate, it is likely that a concave defect appears on the surface of a reflective film or the surface of an absorbing layer disposed on the deposition surface, or the multilayer structure of the reflective film is disordered, causing a defect in an EUV mask blank fabricated by such a glass substrate.

It is preferred that the glass substrate for an EUV mask blank have a low thermal expansion coefficient (preferably of $0\pm1.0\times10^{-8}/°$ C., more preferably of $0\pm0.3\times10^{-8}/°$ C.) in addition to being excellent at smoothness and flatness. Specific examples of the glass substrate having such a low thermal expansion coefficient include a glass substrate made of $SiO_2$—$TiO_2$ based glass, and a glass substrate made of crystallized glass with a β-quartz solid solution precipitated.

It is preferred that the glass substrate for an EUV mask blank have an excellent resistance to cleaning liquid to be used for, e.g., cleaning an EUV mask blank or a patterned EUV photomask.

In order to avoid deformation caused by a film stress of a reflective film or an absorbing layer disposed on the substrate, it is preferred that the glass substrate for an EUV mask blank have a high rigidity. It is particularly preferred that the glass substrate have a specific rigidity of $3\times10^7$ $m^2/s^2$ or more.

The size and the thickness of the glass substrate for an EUV mask blank are properly determined by, e.g., design values of a mask. A specific example of the glass substrate is a glass substrate having outer dimensions of about 6 inch (152.4 mm) square and a thickness of about 0.25 inch (6.3 mm).

FIG. 1 is a schematic view showing a portion of a glass substrate with a concave defect existing thereon and its neighboring area. In FIG. 1, the concave defect 2 exists on the deposition surface 1a of the glass substrate 1. The concave defect 2 has a diameter of, e.g. 100 nm and a depth of, e.g. 30 nm.

Figure 2:
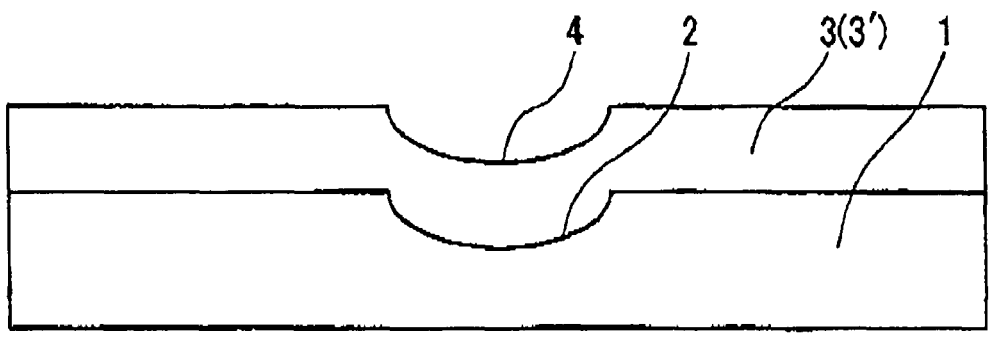
FIG. 2 is a schematic view showing a state wherein a thin film has been disposed on the deposition surface of the glass substrate.

In the first substrate smoothing process according to the present invention, a step for disposing a thin film on a glass substrate is first performed. In this step, a thin film 3 is disposed on the deposition surface 1a of the glass substrate 1. FIG. 2 shows a state wherein the thin film has been disposed on the deposition surface 1a of the glass substrate 1 shown in FIG. 1. In FIG. 2, the thin film 3 has a thickness of about 45 nm, which is about 1.5 times the depth of the concave defect 2. A concave defect 4 appears on a portion of the thin film 3 just above the concave defect 2 since the thin film spreads along the shape of the deposition surface of 1a of the glass substrate 1. In accordance with the first substrate smoothing process according to the present invention, the thin film 3 is provided with a smoothed surface by mitigating or fixing the concave defect 4 appearing on the thin film 3.

It should be noted that the thin film 3 plays a role in mitigating or fixing the concave defect 4 by causing a volume increase to occur therein as described later. Further, the thin film 3 has an advantage of facilitating detecting the presence of a quite small concave defect 2 formed on the deposition surface 1a of the substrate 1. In such an application where even a quite small defect could cause trouble as in a substrate for an EUV mask blank, even a defect that is difficult to be detected by a normal optical detector should be taken care of. However, it is possible to detect such a fine concave defect 2 formed on the deposition surface 1a of the glass substrate 1 by disposing the thin film as in the present invention. The reason why it is possible to detect such a fine concave defect 2 formed on the deposition surface 1a of the glass substrate 1 by disposing the thin film is that the disposition of the thin film on the substrate increases the reflectivity of the substrate to 10% or more from 4% as the reflectivity of general glass to make it possible to obtain a defect image with a higher signal/noise ratio when the defect detection is performed by applying a laser ray on the substrate and analyzing an image reflected from the substrate.

There is no limitation to the material forming the thin film as long as the material performs a chemical reaction accompanied by a volume increase therein when being heated. Although there is no limitation to the chemical reaction performed when being heated as long as a volume increase occurs, the chemical reaction is preferably an oxidation reaction or a nitriding reaction from the viewpoint that the reaction proceeds even when only heating is done, that it is possible to locally perform the reaction only in a heated portion, and that it is easy to control the volume increase caused by the chemical reaction. In order to perform an oxidation reaction, the local heating step may be performed in air or in an atmosphere of oxygen. In order to perform a nitriding reaction, the local heating step may be performed in an atmosphere of nitride.

The material forming the thin film 3 is preferably metal in terms of being apt to chemically react when being heated and of being excellent in the smoothness of the surface of the thin film after a chemical reaction accompanied by a volume increase is performed by heating (hereinbelow, referred to as "being excellent in the smoothness of the surface of the heated thin film 3"). In terms of being apt to chemically react when being heated, of being excellent in the smoothness of the surface of the heated thin film and of having no adverse effect on a reflective film or an absorbing layer disposed on the thin film 3 at the time of fabricating an EUV mask blank, it is preferred that the thin film contain a main component, which is formed of at least one material selected from the group consisting of Al, B, Co, Cr, Ge, Hf, Mo, Nb, Ni, Ru, Si, Ta, Ti, Zn and Zr (hereinbelow, referred to as "Group A"). From the viewpoint that the crystalline state of the thin film 3 is apt to be made amorphous after heating, in particular after oxidation reaction by heating or after nitriding reaction by heating, it is more preferred that thin film contain a main component, which is formed of at least one material selected from the group consisting of Hf, Nb, Si, Ta, Ti and Zr.

The thin film 3 is preferably formed of a material, which has a high increasing rate in the volume increase caused by a chemical reaction performed by heating. Specifically, the thin film is formed of a material, which has an increasing rate $\Delta V$ of preferably 10% or more, more preferably 30% or more in the volume increase caused by heating, the increasing rate $\Delta V$ being found by the following formula:

$$\Delta V(\%) = (V_2 - V_1)/V_1 \times 100$$

Therein, $V_1$ is the volume of a material at normal temperature (20° C.), and $V_2$ is the volume of the heated material. Heating is preferably performed in a range of 50 to 500° C.

In Description, the expression "the volume increase caused by heating" means the volume increase caused by a chemical reaction performed by heating in the explanation described later.

It should be noted that any one of the materials in Group A has an increasing rate $\Delta V$ of 50 to 250%.

The thin film 3 preferably contains a main component formed of at least one material selected from "Group A" in order to meet the above-mentioned requirements. The thin film 3 may contain a main component formed of only one material selected from Group A or main components formed of two materials or more selected from Group A. The thin film 3 may contain a component formed of a material other than the materials in Group A. It should be noted that when the thin film 3 contains a component formed of a material other than the materials in Group A, 50 atomic % or more of the entire components of the thin film 3 are preferably formed of a material or materials in Group A.

When the thin film 3 contains a component formed of a material other than the materials in Group A, 80 atomic % or more of the entire components of the thin film 3 are more preferably formed of a material or materials in Group A.

The thin film is preferably formed of Si, Ta or Ti in Group A from the viewpoint that either one of an oxidation reaction or a nitriding reaction easily occurs. The thin film is more preferably formed of Si in terms of productivity since the material used for the film forming a reflective multilayer film can be utilized as it is.

The thin film 3 may include at least two films, which are formed of different materials from each other. In other words, the thin film 3 may include two or more stacked films. In this case, it is required that the stacked films be formed of different materials, that a chemical reaction accompanied by mutual diffusion occur at the time of heating, and that the chemical reaction be accompanied by a volume increase. Hereinbelow, this sort of thin film 3 is called "a thin film 3 in a stacked structure" in Description. Such a thin film 3 in a stacked structure may include stacked films formed of materials in Group A. It should be noted that even if such a thin film 3 in a stacked structure includes a film formed of a material other than the materials in Group A, such a material may be used as a film material forming the thin film 3 in a stacked structure as long as such a material performs a chemical reaction accompanied by mutual diffusion with a material in Group A at the time of heating.

When the thin film 3 includes three or more of films stacked, it is sufficient that adjacent films are formed of different materials from each other. For example, when the thin film 3 includes three films stacked, the top film and the bottom film may be formed of the same material as each other. In this case, the intermediate film is formed of a different material from the top and bottom films.

Although the depth of the thin film 3 disposed on the deposition surface 1a of the glass substrate 1 varies, depending on the depth of the concave defect 2 existing on the deposition surface 1a, it is preferred that the thin film have a thickness of about 0.5 to 10 times the depth of the concave defect 2. When the thin film 3 has a thickness in the above-mentioned range, it is possible to mitigate or fix a concave defect 4 appearing on the thin film so as to smooth the surface of the thin film 3 by locally heating a portion of the thin film 3 just above the concave defect 2 in the procedure described later. When the thin film 3 has a thickness of less than 0.5 times the depth of the concave defect 2, the concave defect 4 appearing on the thin film 3 could be insufficiently mitigated at the time of locally heating such a portion of the thin film 3 just above the concave defect 2, although the degree of mitigation depends on the rate of the volume increase caused in the material forming the thin film 3 at the time of heating.

On the other hand, when the thin film 3 has a thickness of more than 10 times the depth of the concave defect 2, it is difficult to locally heat only such a portion of the thin film 3 just above the concave defect 2 since heat widely spreads by the thermal conduction of the material forming the thin film 3. In this case as well, the concave defect 4 appearing on the thin film 3 could be insufficiently mitigated.

It should be noted that if the glass substrate 1 have a plurality of concave defects 2 existing on the deposition surface 1a thereof, the thickness of the thin film 3 is set at about 0.5 to 10 times the depth of a concave defect having a maximum depth (the greatest depth of the concave defects). In the case of a thin film 3 in a stacked structure, the entire thickness of the stacked structure is set at about 0.5 to 10 times the depth of a concave defect 2. It is more preferred that the thickness of the thin film 3 be set at about 1 to 5 times the depth of the concave defect 2.

In the first substrate smoothing process according to the present invention, it should be noted that it is impossible to see the depth of a concave defect existing on the deposition surface 1a of the glass substrate 1 at the time of disposing the thin film 3 since detection is performed for a concave existing on the thin film 3 after the thin film 3 is disposed. For this reason, the thickness of the thin film 3 is determined based on the depth of concave defects 2 normally existing on the deposition surface 1a of the glass substrate 1, more specifically the deposition surface 1a with convex defects removed by surface polishing or cleaning. On the deposition surface 1a with convex defects removed by surface polishing or cleaning, concave defects having a depth of about 1 to 50 nm normally exist. For ease in detecting concave defects, the thickness of the thin film 3 is preferably about 5 to 500 nm, more preferably about 5 to 250 nm. In the case of a thin film in a stacked structure, the entire thickness of the thin film 3 is preferably about 5 to 100 nm, more preferably about 5 to 250 nm.

In the first substrate smoothing process according to the present invention, various kinds of dry deposition methods, such as a magnetron sputtering method, an ion beam sputtering method, another sputtering method, a vacuum deposition method or a CVD method are applicable as the method for disposing the thin film 3. Among them, a sputtering method or a CVD method is preferred from the viewpoint that new convex defects (particles) are unlikely to be formed at the time of disposing the thin film. A CVD method is particularly preferred from the viewpoint that new convex defects (particles) are prevented from being formed. A sputtering method is particularly preferred in terms of the adhesion of the thin film 3 to the deposition surface 1a. It should be noted that a sputtering method is preferred from the viewpoint that a common system can be utilized for deposition of a reflective film and an absorbing layer on the thin film 3 after the substrate smoothing process according to the present invention is performed.

In the first substrate smoothing process according to the present invention, the step for disposing the thin film on the glass substrate is followed by a step for detecting a concave defect existing on the glass substrate. Specifically, such a concave defect, which exists on the glass substrate, is measured in terms of its position, diameter, depth and other factors. It should be noted that this step is performed for the purpose of, after disposition of the thin film, detecting a concave defect 4 appearing on the thin film 3 and collect data required for locally heating such a portion of the thin film 3 just above the concave defect 2 in the subsequent step (hereinbelow, referred to as "the concave defect data"), not the purpose of detecting a concave defect 2 existing on the deposition surface 1a of the glass substrate 1. Specifically, data, such as the position of the concave defect 4 on the glass substrate 1, and the shape and the dimensions (diameter and depth) of the concave defect 4, are collected.

Since the thin film 3 is disposed on the deposition surface 1a of the glass substrate 1 as described above, it is possible to easily detect a concave defect 2 formed on the deposition surface 1a (actually a concave defect 4 appearing on the thin film 3) even if the concave defect 2 is a fine concave defect.

The concave defect 4 may be detected by a detection method, which is normally utilized to detect a concave defect existing on a glass substrate. Specific examples of the detection method include a stylus profilometer, an atomic force microscope (AFM), a scanning tunneling microscope (STM), a light-section method (triangulation method), focus error detection method, optical stylus with servomechanism (shape from focus method), a focus scanning method (laser scanning microscope), a confocal laser detection method for defects, a Nomarski differential interference contrast microscopy and a fringe scanning method. Among them, a method for bringing a probe close to or into contact with the surface of the thin film, such as a method using laser ray irradiation, i.e. a confocal laser detection method for defects, an atomic force microscope, a scanning tunneling microscope or a stylus profilometer, is preferred to locally heat such a portion of the thin film just above the concave defect in the subsequent step. A method using a probe is more preferred from the viewpoint that it is possible to measure the diameter and the depth of the concave more accurately.

In the first substrate smoothing process according to the present invention, the step for detecting a concave defect existing on the glass substrate is followed by a step for locally heating a portion of the thin film just above the detected concave defect to perform a chemical reaction accompanied by a volume increase in a material forming the thin film. It should be noted that what is detected in the previous step is not a concave defect 2 existing on the deposition surface 1a of the glass substrate 1, but a concave defect 4 appearing on the thin film 3. In other word, the current step is performed to locally heat such a portion of the S thin film 3 just under the concave defect 4 based on the data on the concave defect obtained by the previous step.

Figure 3:
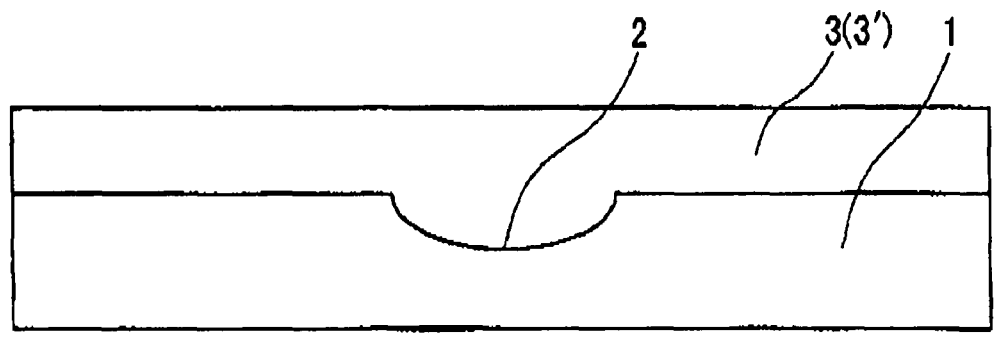
FIG. 3 is a schematic view showing a state wherein the concave defect, which has appeared on the thin film surface, is fixed, causing the thin film surface to be smoothed in accordance with the substrate smoothing process of the present invention.

When such a portion of the thin film 3 just under the concave defect 4 is locally heated, such a portion of the thin film 3 just under the concave defect 4 performs a chemical reaction to locally causes a volume increase since the thin film 3 is formed of a material, which performs a chemical reaction accompanied by a volume increase by being heated. In this way, the concave defect 4 is fixed, and the thin film 3 is provided with a smoothed surface as shown in FIG. 3.

There is no limitation to the means for locally heating a portion of the thin film 3 just under a concave defect 4 in the current step as long as the means can locally heat such a portion of the thin film 3 just under the concave defect 4. A preferred example of the method for locally heating a portion of the thin film 3 just under a concave defect 4 is a method for applying a laser ray to a concave defect 4. There are no limitations to the conditions for applying a laser ray to a concave defect 4 as long as it is possible to locally heat a portion of the thin film 3 just under the concave defect 4. However, if an applied laser ray has too larger a diameter than the diameter of the concave defect 4, the thin film 3 not only is heated only in such a portion thereof just under the concave defect 4 but also is heated in a wide range thereof. In such a case, it is likely that it is difficult to locally heat only a portion of the thin film 3 just under the concave defect 4. From this point of view, it is preferred that the applied laser ray have a diameter of two times or less the diameter of the concave defect 4. When the applied laser ray has a diameter of two times or less the diameter of the concave defect 4, it is possible to fix the concave defect 4 to make the thin film 3 flat by applying the laser ray even if the concave defect 4 has a relatively small diameter, for example, even when the concave defect 4 has a diameter of 30 nm or less. It is more preferred that the applied laser ray have a diameter of one time or less the diameter of the concave defect 4.

It should be noted that it is not preferred that the laser ray have too small a diameter than the concave defect 4. In such a case, it takes long to heat a portion of the thin film 3 just under the concave defect 4 or it is necessary to move the position of application of the laser ray. The laser ray has a diameter of preferably 0.5 times or more the diameter of the concave defect 4.

In the first substrate smoothing process according to the present invention, when both of the step for detecting a concave defect 4 appearing on the thin film 3 and the step for locally heating a portion of the thin film just under the detected concave defect 4 are performed by applying a laser ray, it is preferred that both steps use a common laser ray source. In other words, it is preferred that both steps utilize a common system for laser ray irradiation. When a concave defect 4 is detected by applying a laser ray, followed by applying a laser ray to a portion of the thin film 3 just under the detected concave defect 4 from the same laser ray source as the one utilized in detection of the concave defect, it is possible to apply the laser ray to such a portion of the thin film 3 just under the detected concave defect 4 with more accuracy since it is possible to utilize the data on the concave defect obtained by detection of the concave defect 4 as it is.

When both of the step for detecting a concave defect 4 and the step for locally heating a portion of the thin film 3 just under the concave defect 4 are performed by utilizing such a common system for laser ray irradiation, it is preferred to scan the laser ray on the thin film 3 so as to prevent the thin film 3 from being heated at the time of detecting the concave defect 4 and to apply the laser ray to the concave defect 4 for a certain period of time at the time of locally heating such a portion of the thin film 3 just under the concave defect 4.

Figure 4:
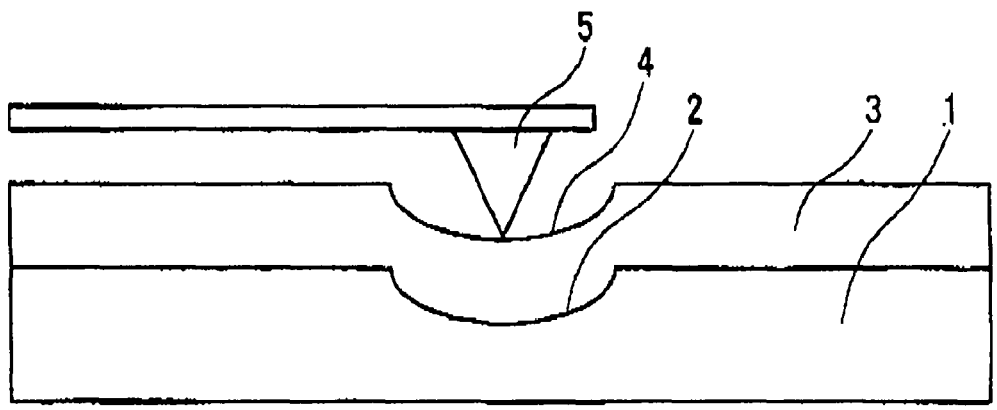
FIG. 4 is a schematic view showing a state wherein a heatable probe is brought into contact with a concave defect appearing on a thin film surface, and a portion of the thin film just under the concave defect is to locally heated.

Another preferred example of the step for locally heating a portion of the thin film 3 just under a concave defect 4 is a method wherein an AFM, an STM or a stylus profilometer, which has a heatable probe, is used to detect a concave defect existing on the thin film 3, followed by bringing the probe close to or into contact with the concave defect 4 and heating the probe to locally heating such a portion of the thin film 3 just under the concave defect 4. FIG. 4 shows a state wherein a heatable probe 5 is brought into contact with a concave defect 4, and a portion of the thin film 3 just under the concave defect 4 is locally heated. This method can locally heat such a portion of the thin film 3 just under the concave defect 4 with more accuracy because of being able to utilize the data on the concave defect obtained by detection of the concave defect 4 as it is. An example of such an AFM or an STM having a heatable probe is a local thermal analysis system called "nano-TA" manufactured by Anasys Instruments in the US. Preferred examples of the material for the heatable probe include monocrystalline Si and SiN.

It is preferred that such a portion of the thin film 3 just under the concave defect be locally heated by the above-mentioned procedure, causing the crystalline state of the heated portion of the thin film 3 to be made amorphous. In other words, it is preferred that the crystalline state of the material forming the thin film 3 be amorphous by a chemical reaction performed at the time of heating. The heated portion of the thin film 3 is a portion of the thin film that has the concave defect 4 fixed and smoothed by locally causing a volume increase due to a chemical reaction in the material forming the thin film 3. When the crystalline state of such a portion is amorphous, the smoothed thin film is provided with a surface having a more excellent smoothness. Specifically, the smoothed thin film 3 preferably has a surface roughness of b 0.5 nm or less in rms. When the smoothed thin film 3 has a surface roughness of 0.5 nm or less in rms, the multilayer structure of a reflective film disposed on the thin film 3 is unlikely to be disordered since the thin film 3 has a sufficiently smooth surface. If the multilayer structure of such a reflective film is disordered, it is likely that the fabricated EUV mask blank is defective. When the thin film 3 has such a surface roughness, the fabricated EUV mask blank has an excellent dimensional accuracy in patterning because of being prevented from having a large edge roughness. If the thin film 3 has a large surface roughness, a reflective film disposed on the thin film necessarily has a large surface roughness, causing an absorbing layer on the reflective film to have a large surface roughness. In such a case, a pattern formed in the absorbing layer has a large edge roughness, degrading the dimensional accuracy in patterning. The thin film 3 has a surface roughness of more preferably 0.4 nm or less in rms, further preferably 0.3 nm or less in rms.

When the phrase "the crystalline state of such a portion is amorphous" is used in Description, not only an amorphous structure having no crystalline structure but also an amorphous structure having fine crystalline structures are included. Whether the crystalline state of such a portion is amorphous or not, i.e. whether such a portion has an amorphous structure or contains fine crystalline structures, may be determined by X-ray diffractometry (XRD). When the crystalline state of such a portion is an amorphous structure having no crystalline structure or containing fine crystalline structures, no sharp peak is found in the diffraction peak obtained by XRD measurement.

It is preferred in terms of the thin film 3 having a smooth surface that the crystalline state of the entire portion of the thin film 3 be amorphous after heating. In such a case, the crystalline state of the entire portion of the thin film 3 is amorphous at the time when the thin film 3 is disposed. The crystalline state of the entire portion of the thin film 3 keeps an amorphous state even after the material forming such a portion of the thin film just under the concave defect 4 is heated to perform a chemical reaction.

Now, the second substrate smoothing process according to the present invention will be described. In the second substrate smoothing process according to the present invention as well, a step for disposing a thin film 3' on a glass substrate is first performed. It should be noted that the material forming the thin film 3' is anodized to perform a chemical reaction accompanied by a volume increase in the second substrate smoothing process according to the present invention. Although there is no limitation to the chemical reaction performed by anodization as long as a volume increase occurs, it is preferred that the chemical reaction be performed only by anodization, that the chemical reaction be locally developed only in an anodized portion, and that it be easy to control the volume increase caused by the chemical reaction.

The material forming the thin film 3' is preferably formed of a metal in terms of being apt to chemically react at the time of anodization and of being excellent in the smoothness of the surface of the thin film after a chemical reaction accompanied by a volume increase is performed by anodization (hereinbelow, referred to as "being excellent in the smoothness of the surface of the anodized thin film"). In terms of being apt to chemically react at the time of anodization, of being excellent in the smoothness of the surface of the anodized thin film and of having no adverse effect on a reflective film or an absorbing layer disposed on the thin film 3' at the time of fabricating an EUV mask blank, it is preferred that the thin film contain a main component, which is formed of at least one material selected from Group A. From the viewpoint that the crystalline state of the thin film 3' is apt to be made amorphous after anodization, it is more preferred that thin film contain a main component, which is formed of at least one material selected from the group consisting of Hf, Nb, Si, Ta, Ti and Zr.

The thin film 3' is preferably formed of a material, which has a high increasing rate in the volume increase caused by a chemical reaction performed by anodization. Specifically, the thin film is formed of a material, which has an increasing rate ΔV' of preferably 10% or more, more preferably 30% or more in the volume increase caused by anodization, the increasing rate ΔV' being found by the following formula:

$$\Delta V'(\%) = (V_2' - V_1)/V_1 \times 100$$

Therein, $V_1$ is the volume of a material at normal temperature (20° C.), and $V_2'$ is the volume of the anodized material.

In Description, the expression "the volume increase caused by anodization" means the volume increase caused by a chemical reaction performed by anodization in the explanation described later.

It should be noted that any one of the materials in Group A has an increasing rate ΔV' of 50 to 250%.

The thin film 3' preferably contains a main component formed of at least one material selected from "Group A" in order to meet the above-mentioned requirements. The thin film 3' may contain a main component formed of only one material selected from Group A or main components formed of two materials or more selected from Group A. The thin film 3' may contain a component formed of a material other than the materials in Group A. It should be noted that when the thin film 3' contains a component formed of a material other than the materials in Group A, 50 atomic % or more of the entire components of the thin film 3' are preferably formed of a material or materials in Group A.

When the thin film 3' contains a component formed of a material other than the materials in Group A, 80 atomic % or more of the entire components of the thin film 3 are more preferably formed of a material or materials in Group A.

The thin film is preferably formed of Si, Ta or Ti in Group A from the viewpoint that the chemical reaction easily occurs at the time of anodization. The thin film is more preferably formed of Si in terms of productivity since the material used for the film forming a reflective multilayer film can be utilized as it is.

Although the depth of the thin film 3' disposed on the deposition surface 1a of the glass substrate 1 varies, depending on the depth of a concave defect 2 existing on the deposition surface 1a, it is preferred that the thin film have a thickness of 0.5 times or more the depth of the concave defect 2. When the thin film 3' has a thickness in the above-mentioned range, it is possible to mitigate or fix a concave defect 4 appearing on the thin film so as to smooth the surface of the thin film 3 by locally anodizing a portion of the thin film 3' just above the concave defect 2 in the procedure described later. When the thin film 3' has a thickness of less than 0.5 times the depth of the concave defect 2, the concave defect 4 appearing on the thin film 3' could be insufficiently mitigated at the time of locally anodizing such a portion of the thin film 3' just above the concave defect 2, although the degree of mitigation depends on the rate of the volume increase caused in the material forming the thin film 3' at the time of anodization.

It should be noted that if the glass substrate 1 has a plurality of concave defects 2 existing on the deposition surface 1a thereof, the thickness of the thin film 3' is set at 0.5 times or more the depth of a concave defect having a maximum depth (the greatest depth of the concave defects).

It is more preferred that the thickness of the thin film 3' be set at one time or more the depth of the concave defect 2.

As in the method for disposing the thin film 3 in the first substrate smoothing process according to the present invention, various kinds of dry deposition methods are applicable as the method for disposing the thin film 3'. Among them, a sputtering method and a CVD method are preferred from the viewpoint that new convex defects (particles) are unlikely to be formed at the time of disposing the thin film. A CVD method is particularly preferred from the viewpoint that new convex defects (particles) are prevented from being formed. A sputtering method is particularly preferred in terms of the adhesion of the thin film 3' to the deposition surface 1a. It should be noted that a sputtering method is preferred from the viewpoint that a common system can be utilized for deposition of a reflective film or an absorbing layer on the thin film 3' after the second substrate smoothing process according to the present invention is performed.

The step for disposing the thin film 3' on the glass substrate is followed by a step for detecting a concave defect existing on the glass substrate, which is performed in the same procedure as the first substrate smoothing process according to the present invention.

The step for detecting a concave defect existing on the glass substrate is followed by a step for locally anodizing a portion of the thin film 3' just above the detected concave defect to perform a chemical reaction accompanied by a volume increase in a material forming the thin film 3'. It should be noted that what is detected in the previous step is not a concave defect 2 existing on the deposition surface 1a of the glass substrate 1, but a concave defect 4 appearing on the thin film 3'. In other word, the current step is performed to locally anodize such a portion of the thin film 3' just under the concave defect 4 based on the data on the concave defect obtained by the previous step.

When such a portion of the thin film 3' just under the concave defect 4 is locally anodized, such a portion of the thin film 3' just under the concave defect 4 performs a chemical reaction to locally causes a volume increase since the thin film 3' is formed of a material, which performs a chemical reaction accompanied by a volume increase by being anodized. In this way, the concave defect 4 is fixed, and the thin film 3' is provided with a smoothed surface as shown in FIG. 3.

Figure 5:
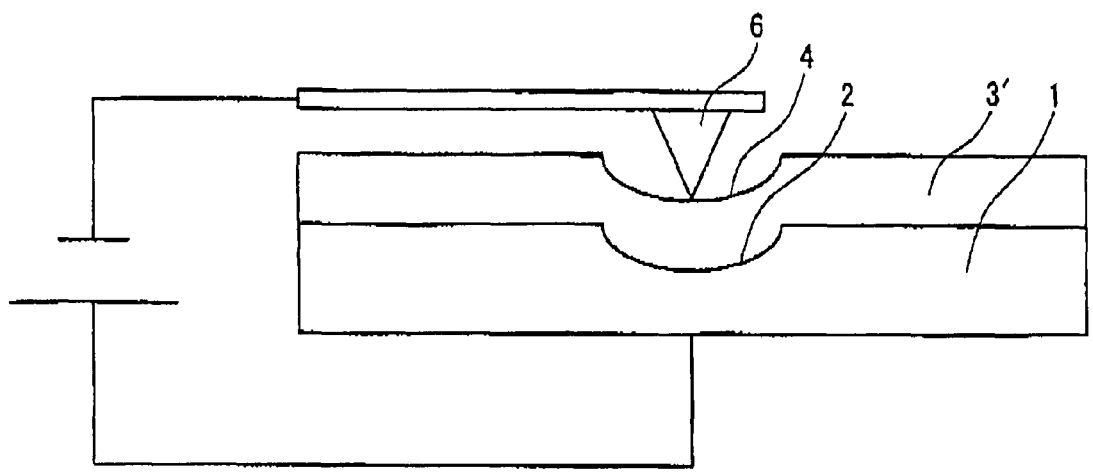
FIG. 5 is a schematic view showing a state wherein an energizable probe is brought into contact with a concave defect appearing on a thin film surface, and a portion of the thin film just under the concave defect is locally heated.

There is no limitation to the means for locally anodizing a portion of the thin film 3' just under a concave defect 4 in the current step as long as the means can locally anodize such a portion of the thin film 3' just under the concave defect 4. Another preferred example of the step for locally anodizing a portion of the thin film 3' just under a concave defect 4 is a method wherein an AFM, an STM or a stylus profilometer, which has an energizable probe, is used to detect a concave defect 4 existing on the thin film 3', followed by bringing the probe close to or into contact with the concave defect 4 and applying a voltage across the probe and the thin film 3' to locally anodize such a portion of the thin film 3' just under the concave defect 4. FIG. 5 shows a state wherein such an energizable probe 6 is brought into contact with a concave defect 4, and a portion of the thin film 3' just under the concave defect 4 is locally anodized by applying a d.c. voltage across the probe 6 and the thin film 3' with the probe and the thin film 3' serving as a positive side and a negative side, respectively. This method can locally anodize such a portion of the thin film 3' just under the concave defect 4 with more accuracy because of being able to utilize the data on the concave defect 4 obtained by detection of the concave defect as it is. The energizable probe needs to be formed of a conductive material, and preferred examples of the conductive material include monocrystalline Si and SiN.

It is preferred that such a portion of the thin film 3' just under the concave defect 4 be locally anodized by the above-mentioned procedure, causing the crystalline state of the anodized portion of the thin film 3' to be made amorphous. In other words, it is preferred that the crystalline state of the material forming the thin film 3' be made amorphous by a chemical reaction performed at the time of anodization.

The anodized portion of the thin film 3' is a portion of the thin film 3' that has the concave defect 4 fixed and smoothed by locally causing a volume increase due to a chemical reaction in the material forming the thin film.

When the crystalline state of such a portion is amorphous, the smoothed thin film 3' is provided with a surface having a more excellent smoothness. Specifically, the smoothed thin film 3' preferably has a surface roughness of 0.5 nm or less in rms. When the smoothed thin film 3' has a surface roughness of 0.5 nm or less in rms, the multilayer structure of a reflective film disposed on the thin film 3' is unlikely to be disordered since the thin film 3' has a sufficiently smooth surface. If the multilayer structure of such a reflective film is disordered, it is likely that the fabricated EUV mask blank is defective. When the thin film has such a surface roughness, the fabricated EUV mask blank has an excellent dimensional accuracy in patterning because of being prevented from having a large edge roughness. If the thin film 3' has a large surface roughness, a reflective film disposed on the thin film 3' necessarily has a large surface roughness, causing an absorbing layer formed on the reflective film to have a large surface roughness. In such a case, a pattern formed in the absorbing layer has a large edge roughness, degrading the dimensional accuracy in patterning. The thin film 3' has a surface roughness of more preferably 0.4 nm or less in rms, further preferably 0.3 nm or less in rms.

It is preferred in terms of the thin film 3' having a smooth surface that the crystalline state of the entire portion of the thin film 3' be amorphous after anodization. In such a case, the crystalline-state of the entire portion of the thin film 3' is amorphous at the time when the thin film 3' is disposed. The crystalline state of the entire portion of the thin film 3' keeps an amorphous state even after the material forming such a portion of the thin film 3' just under the concave defect 4 is anodized, performing a chemical reaction.

In the first substrate smoothing process according to the present invention, in a case where a heatable probe 5 is used to locally heat a portion of the thin film 3 just under a concave defect 4, when the probe 5 is formed of a material having a higher hardness than the material forming the thin film 3, it is also possible to remove a convex defect existing on the thin film 3 after heating. When such a portion of the thin film 3 just under a concave defect 4 is locally heated, there is a case where a convex defect is formed on the thin film 3 by an excessive volume increase. There is also a case where it is difficult to make the thin film 3 flat with a single treatment by controlling a change in the form of a defect, which is caused by a volume increase when locally heating such a portion of the thin film 3 just under a concave defect 4. In such cases, in order to make the thin film flat with a treatment described later, an excessive volume increase is intentionally caused to form a convex defect on the thin film 3 in some events.

In the second substrate smoothing process according to the present invention as well, in a case where an energizable probe 6 is used to locally anodize a portion of the thin film 3' just under a concave defect 4, when the probe 6 is formed of a material having a higher hardness than the material forming the thin film 3', it is also possible to remove a convex defect existing on the thin film 3' after anodization. When such a portion of the thin film 3' just under a concave defect 4 is locally anodized, there is a case where a convex defect is formed on the thin film 3' by an excessive volume increase. There is also a case where it is difficult to make the thin film 3' flat with a single treatment by controlling a change in the form of a defect, which is caused by a volume increase when locally anodizing such a portion of the thin film 3 just under a concave defect 4. In such cases, in order to make the thin film flat with a treatment described later, an excessive volume increase is intentionally caused to form a convex defect on the thin film 3 in some events.

Figure 6:
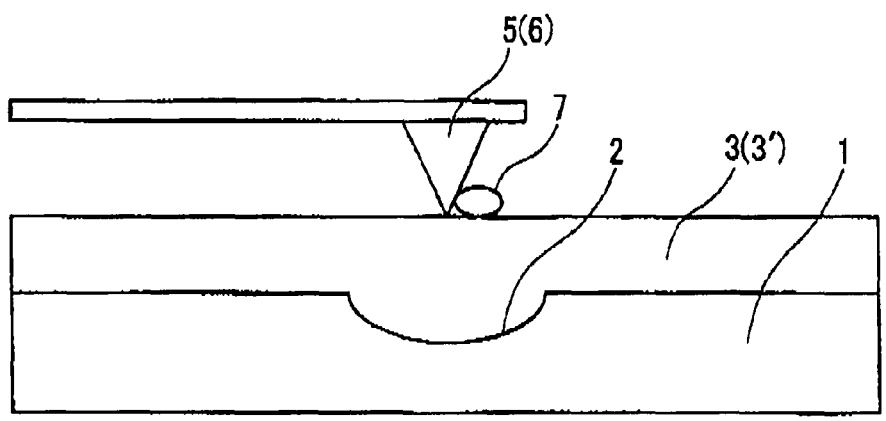
FIG. 6 is a schematic view showing a state wherein a convex defect, which is newly formed on a thin film surface, is removed by a probe.

In such cases, it is possible to remove a convex defect newly formed on the thin film 3 or 3' by using the probe 5 or 6 as shown in FIG. 6. In FIG. 6, reference numeral 7 is a convex defect removed by using the probe 5 or 6. Thus, it is possible to increase the surface smoothness of the thin film 3 or 3'. Even if a newly convex defect is formed on the thin film 3 after heating when a portion of the thin film 3 just under a concave defect 4 is locally heated by applying a laser ray, it is possible to remove the convex defect by using a needle member.

When an EUV mask blank is fabricated by using the glass substrate having the thin film 3 or 3' smoothed by the above-mentioned procedure, the thin film 3 or 3' has a reflecting film disposed thereon to reflect EUV light and an absorbing layer disposed on the reflective film to absorb EUV light.

There is no limitation to the reflective film deposited on the thin film 3 or 3' as long as the reflective film has characteristics required as a reflective film of an EUV mask blank. The particularly required characteristic for the reflective film is that the reflective film is a film having a high reflectivity with respect to EUV light. Specifically, when a reflective film is irradiated with a ray in the wavelength range of EUV light, the reflective film has a maximum reflectivity of preferably 60% or more, more preferably 65% or more with respect to a ray having a wavelength of about 13.5 nm. Even if the reflective film has a protective film disposed thereon as described later, the reflective film has a maximum reflectivity of preferably 60% or more, more preferably 65% or more with respect to a ray having a wavelength of about 13.5 nm.

The reflective film is normally formed of a reflective multilayer film, which has high refractive films and low refractive films alternately stacked in terms of achieving a high reflectivity with respect to EUV light. In the reflective multilayer film forming the reflective film, each of the low refractive films is usually formed of Mo while each of the high refractive films is usually formed of Si. In other words, the reflective multilayer film is most typically a Mo/Si reflective multilayer film. However, the reflective multilayer film is not limited to this sort of film. The reflective multilayer film may be a Mo compound/Si compound reflective multilayer film or a Si/Mo/Ru reflective multilayer film.

The thickness and the repeating unit of the films forming the reflective multilayer film as such a reflective film may be property determined, depending on the used materials and the reflectivity required for the reflective film with respect to EUV light. For example, when the reflective film is a Mo/Si reflective multilayer film, the reflective multilayer film is configured to have Mo films having a thickness of 2.3±0.1 nm and Si films having a thickness of 4.5±0.1 nm stacked by a repeating unit of 30 to 60.

Each of the films forming the reflective multilayer film as such a reflective film may be deposited so as to have a desired thickness by a known deposition method, such as a magnetron sputtering method or an ion beam sputtering method. For example, when a Si/Mo reflective multilayer film is deposited by an ion beam sputtering method, it is preferred that a Si film be deposited so as to have a thickness of 4.5 nm at a deposition rate of from 0.03 to 0.30 nm/sec by using a Si target as the target and an Ar gas as the sputtering gas (having a gas pressure of $1.3 \times 10^{-2}$ Pa to $2.7 \times 10^{-2}$ Pa), and applying an ion acceleration voltage of 300 to 1,500 V, and a Mo film be deposited so as to have a thickness of 2.3 nm at a deposition rate of from 0.03 to 0.30 nm/sec by using a Mo target as the target and an Ar gas as the sputtering gas (having a gas pressure of $1.3 \times 10^{-2}$ Pa to $2.7 \times 10^{-2}$ Pa), and applying an ion acceleration voltage of 300 to 1,500 V. The Si/Mo reflective multilayer film is deposited, stacking such Si films and such Mo films by 40 to 50 cycles, each cycle containing the above-mentioned deposition steps.

In order to prevent the surface of the reflective multilayer film from being oxidized, it is preferred that the top layer of the reflective multilayer film as the reflective film be formed of a material difficult to be oxidized. The layer formed of a material difficult to be oxidized serves as a capping layer of the reflective film. A specific example of the layer, which is formed of a material difficult to be oxidized and serves as a capping layer, is a Si layer. When the reflective multilayer film as the reflective film is a Si/Mo film, the top layer can serve as a capping layer by forming the top layer from such a Si layer. In this case, it is preferred that the capping layer have a film thickness of 11.0±1.0 nm.

An example of the material forming the absorbing layer deposited on the reflective multilayer film is a material having a high absorption coefficient with respect to EUV light, specifically Cr, Ta or a nitride thereof. Among them, TaN is preferred because of being apt to become amorphous and have a smooth surface shape. It is preferred that the absorbing layer have a thickness of from 50 to 100 nm. There is no limitation to the method for depositing the absorbing layer as long as a sputtering method is used. Either one of a magnetron sputtering method or an ion beam sputtering method may be used.

When a TaN film is deposited as the absorbing layer by an ion beam sputtering method, it is preferred that the TaN film be deposited so as to have a thickness of from 50 to 100 nm at a deposition rate of from 0.01 to 0.1 nm/sec by using a Ta target as the target and a $N_2$ gas as the sputtering gas (having a gas pressure of $1.3 \times 10^{-2}$ Pa to $2.7 \times 10^{-2}$ Pa), and applying a voltage of 300 to 1,500 V.

When depositing the absorbing layer by using a sputtering method, it is preferred to perform the deposition, using a rotor to rotating the substrate.

The reflective film and the absorbing layer may have a buffer layer be deposited therebetween. Examples of the material forming the buffer layer include Cr, Al, Ru, Ta, a nitride thereof, $SiO_2$, $Si_3N_4$ and $Al_2O_3$. It is preferred that the buffer layer have a thickness of from 10 to 60 nm.

What is claimed is:

1. A process for smoothing a surface of a glass substrate for a reflective mask blank used in EUV lithography, comprising:
   disposing a thin film on a glass substrate to cover a concave defect existing on a surface of the glass substrate;
   detecting a concave defect on the thin film which correspond to the concave defect existing on the surface of the glass substrate; and
   locally heating a portion of the thin film at the detected concave defect to perform a chemical reaction accompanied by a volume increase in a material forming the thin film, the volume increase at least partially filling the concave defect in the thin film to smooth the surface of the thin film.

2. The process according to claim 1, wherein the chemical reaction is an oxidation reaction.

3. The process according to claim 1, wherein the chemical reaction is a nitriding reaction.

4. The process according to claim 1, wherein the thin film contains a main component, which is formed of at least one material selected from the group consisting of Al, B, Co, Cr, Ge, Hf, Mo, Nb, Ni, Ru, Si, Ta, Ti, Zn and Zr.

5. The process according to claim 1, wherein the thin film contains at least two films formed of different materials; and
   wherein the chemical reaction is accompanied by mutual diffusion between the different materials forming the at least two films.

6. The process according to claim 5, wherein one of the at least two films contains a main component, which is formed of at least one material selected from the group consisting of Al, B, Co, Cr, Ge, Hf, Mo, Nb, Ni, Ru, Si, Ta, Ti, Zn and Zr.

7. The process according to claim 1, wherein the thin film has a thickness of from 0.5 to 10 times a maximum depth of the concave defect existing on the glass substrate.

8. The process according to claim 1, wherein a crystalline state of the locally heated portion of the thin film is made amorphous by the chemical reaction.

9. The process according to claim 1, wherein a crystalline state of the thin film is amorphous after the local heating step is performed.

10. The process according to claim 1, wherein the local heating step is performed by applying a laser ray on the portion of the thin film having the concave defect.

11. The process according to claim 10, wherein the laser ray has a diameter of two times or less a diameter of the concave defect existing on the glass substrate.

12. The process according to claim 10, wherein the concave defect is detected by applying a laser ray; wherein the laser ray used in the local heating step and the laser ray used in detection of the concave defect have a common laser ray source.

13. The process according to claim 1, wherein the concave defect is detected by an atomic force microscope (AFM), a scanning tunneling microscope (STM) or a stylus profilometer, which has a heatable probe; and
    wherein the local heating step is performed by heating the heatable probe brought close to or into contact with the portion of the thin film having the concave defect.

14. The process according to claim 1, wherein the thin film has a surface polished by a needle member after the local heating step is performed.

15. The process according to claim 13, wherein the thin film has a surface polished by the probe after the local heating step is performed.

16. A process for smoothing a surface of a glass substrate for a reflective mask blank used in EUV lithography, comprising:
    disposing a thin film on a glass substrate to cover a concave defect existing on a surface of the glass substrate;
    detecting a concave defect on the thin film which correspond to the concave defect existing on the surface of the glass substrate; and
    locally anodizing a portion of the thin film at the detected concave defect to perform a chemical reaction accompanied by a volume increase in a material forming the thin film, the volume increase at least partially filling the concave defect in the thin film to smooth the surface of the thin film.

17. The process according to claim 16, wherein the thin film contains a main component, which is formed of at least one material selected from the group consisting of Al, B, Co, Cr, Ge, Hf, Mo, Nb, Ni, Ru, Si, Ta, Ti, Zn and Zr.

18. The process according to claim 16, wherein the thin film has a thickness of 0.5 times or more a maximum depth of the concave defect existing on the glass substrate.

19. The process according to claim 16, wherein a crystalline state of the locally anodized portion of the thin film is made amorphous by the chemical reaction.

20. The process according to claim 16, wherein a crystalline state of the thin film is amorphous after the local anodizing step is performed.

21. The process according to claim 16, wherein the concave defect be detected by an atomic force microscope (AFM), a scanning tunneling microscope (STM) or a stylus profilometer, which has an energizable probe; and
    wherein the local heating step is performed by applying a voltage across the thin film and the energizable probe brought close to or into contact with the portion of the thin film just above the concave defect.

22. The process according to claim 16, wherein the thin film has a surface polished by a needle member after the local anodizing step is performed.

23. The process according to claim 21, wherein the thin film has a surface polished by the probe after the local anodizing step is performed.

24. A substrate with a reflective film for EUV lithography, which has a reflective film for reflecting EUV light disposed on a glass substrate for a reflective mask blank used in EUV lithography, the substrate for a reflective mask blank having a surface smoothed by the process according to claim 1.

25. A reflective mask blank for EUV lithography, which has an absorbing layer disposed on the reflective film of the substrate with a reflective film according to claim 24.

26. A reflective mask for EUV lithography, wherein the EUV mask blank according to claim 25 is patterned.

* * * * *